(12) United States Patent
England (10) Patent No.: US 9,397,073 B1
(45) Date of Patent: Jul. 19, 2016

(54) METHOD OF USING A BACK-END-OF-LINE CONNECTION STRUCTURE TO DISTRIBUTE CURRENT ENVENLY AMONG MULTIPLE TSVS IN A SERIES FOR DELIVERY TO A TOP DIE

(71) Applicant: GLOBALFOUNDRIES Inc., Grand Cayman (KY)

(72) Inventor: Luke England, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/664,970

(22) Filed: Mar. 23, 2015

(51) Int. Cl.
*H01L 23/48* (2006.01)
*H01L 21/768* (2006.01)
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/0651* (2013.01); *H01L 2225/06517* (2013.01); *H01L 2225/06548* (2013.01)

(58) Field of Classification Search
CPC . H01L 23/48; H01L 21/768; H01L 21/76898; H01L 23/481; H01L 24/11; H01L 25/0657
See application file for complete search history.

(56) References Cited

U.S. PATENT DOCUMENTS

| | | | | |
|---|---|---|---|---|
| 2008/0079174 A1* | 4/2008 | Punzalan | ................ | H01L 23/13 257/777 |
| 2008/0111248 A1* | 5/2008 | Foong | ................ | H01L 25/0652 257/778 |
| 2010/0225002 A1* | 9/2010 | Law | ................ | H01L 21/76898 257/774 |
| 2011/0204505 A1* | 8/2011 | Pagaila | ................ | H01L 21/568 257/686 |
| 2012/0242367 A1* | 9/2012 | Goel | ................ | G01R 31/31855 326/16 |
| 2013/0200528 A1* | 8/2013 | Lin | ................ | H01L 21/6836 257/774 |

* cited by examiner

*Primary Examiner* — Phuc Dang
(74) *Attorney, Agent, or Firm* — Ditthavong & Steiner, P.C.

(57) ABSTRACT

A method of using a BEOL connection structure to distribute current evenly among multiple TSVs in a series for delivery to a top die and a BS-RDL PDN to distribute a uniform power/ground network and the resulting device are provided. Embodiments include providing a bottom die of a 3D IC stack, the bottom die having a connection pad; providing a top die of the 3D IC stack, the top die having a plurality of power/ground micropillars; forming a BEOL connection structure between the bottom and top dies, the BEOL connection structure having a plurality of power supply TSVs; forming a BS-RDL PDN between the bottom and top dies, the BS-RDL PDN including a plurality of the BEOL connection structures; and connecting the connection pad electrically to the micropillars through the power supply TSVs and the BS-RDL PDN.

12 Claims, 11 Drawing Sheets

METHOD OF USING A BACK-END-OF-LINE CONNECTION STRUCTURE TO DISTRIBUTE CURRENT ENVENLY AMONG MULTIPLE TSVS IN A SERIES FOR DELIVERY TO A TOP DIE

TECHNICAL FIELD

The present disclosure relates to three dimensional (3D) integrated circuit (IC) stacks having through-silicon-vias (TSVs). The present disclosure is particularly applicable to logic-on-logic configurations.

BACKGROUND

In a 3D logic-on-logic configuration, the top logic die must be powered with current coming directly from the substrate. Depending on the particular device, a current delivery requirement may be 300 milliamps (mA) to 350 mA per controlled-collapse chip connection (C4) or copper pillar (CuP) connection on the bottom die of the 3D IC stack. The required current must be transferred directly to the top die, which cannot be done through a single TSV. In addition, there is the problem of the current spreading throughout the top die because of "bottlenecking" due to the micropillar connections of the top die, e.g., a max current load for each micropillar is approximately 65 mA.

A need therefore exists for methodology enabling full current flow from a bottom die C4/CuP connection to the top die of a 3D IC stack and a uniform power/ground distribution network and the resulting device.

SUMMARY

An aspect of the present disclosure is a method of using a back-end-of-line (BEOL) connection structure to distribute current evenly among multiple TSVs in a series for delivery to a top die and a backside redistribution layer (BS-RDL) power delivery network (PDN) to distribute a uniform power/ground network.

Another aspect of the present disclosure is a 3D IC logic stack device including a series of TSVs connected to a C4/CuP pad and a BS-RDL PDN.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a bottom die of a 3D IC stack, the bottom die having a connection pad; providing a top die of the 3D IC stack, the top die having a plurality of power/ground micropillars; forming BEOL connection structure between the bottom and top dies, the BEOL connection structure having a plurality of power supply TSVs; forming a BS-RDL PDN between the bottom and top dies, the BS-RDL PDN including a plurality of the BEOL connection structures; and connecting the connection pad electrically to the micropillars through the power supply TSVs and the BS-RDL PDN.

Aspects of the present disclosure include forming the BEOL connection structure by: forming a metal cap layer over the connection pad; forming a first metal layer over the metal cap layer; forming a plurality of metal vias between the metal cap layer and the first metal layer, the metal vias evenly distributed on opposite edges of the metal cap layer; forming a second metal layer over the first metal layer; forming the plurality of power supply TSVs in series with a minimum pitch above a center of the connection pad; forming a first group of intermetal vias between the first metal layer and the second metal layer; forming a second group of intermetal vias between the second metal layer and a top of the power supply TSVs; and forming a plurality of BEOL connections between the power supply TSVs, the BEOL connections connecting the power supply TSVs together. Other aspects include forming the BS-RDL PDN by: forming a plurality of parallel alternating power and ground connection lines on a backside of the bottom die, the power and ground connection lines being evenly distributed; and connecting the power and ground lines to the power supply TSVs. Further aspects include forming the power and ground lines between under-bump metallurgy (UBM) pads on a backside of the bottom die. Additional aspects include forming the BS-RDL by: revealing a plurality of TSVs on a backside of the bottom die down to a passivation layer of the bottom die, the plurality of TSVs including the power supply TSVs; forming a seed layer over the passivation layer; forming a first photoresist layer over the seed layer; patterning a RDL opening and a UBM opening through the first photoresist layer down to the seed layer, the RDL opening formed over the power supply TSVs and the UBM opening having a first width; forming a RDL and a UBM capture pad on the seed layer through the RDL and UBM openings, respectively; removing the first photoresist layer; forming a second photoresist layer over the RDL and the UBM capture pad; patterning openings in the second photoresist layer over the RDL and the UBM capture pad, the openings having a second width less than the first width; forming UBMs on the RDL and the UBM capture pad through the openings; removing the second photoresist layer; and removing the seed layer on opposite sides of the RDL and the UBM capture pad. Another aspect includes patterning the openings based on a location of the micropillars. Other aspects include patterning the openings 1 micron (am) to 2 μm less than the UBM opening. Further aspects include forming the UBMs by: forming one or more solderable layers on the RDL and the UBM capture pad. Additional aspects include the connection pad being formed of C4 or CuP. Another aspect includes the bottom and top dies being logic dies.

Another aspect of the present disclosure is a 3D IC stack device including: a bottom die connected to a connection pad on a front side the bottom die; a top die having a plurality of power/ground micropillars; a BEOL connection structure formed between the bottom and top dies, the BEOL connection having a plurality of power supply TSVs; and a BS-RDL PDN formed between the bottom and top ties, the BS-RDL PDN including a plurality of the BEOL connection structures.

Aspects of the device include the connection pad and the micropillars being electrically connected through the power supply TSVs and the BS-RDL PDN. Other aspects include the BEOL connection structure being formed of the following: a metal cap layer formed over the connection pad; a first metal layer formed over the metal cap layer; a plurality of metal vias formed between the metal cap layer and the first metal layer on opposed edges of the metal cap layer, the metal vias being evenly distributed; a second metal layer formed over the first metal layer; a plurality of the power supply vias formed in series with a minimum pitch above a center of the connection pad; a first group of intermetal vias formed between the first metal layer and the second metal layer; a second group of intermetal vias formed between the second metal layer and a top of the power supply vias; and a plurality of BEOL connections formed between the plurality of power supply TSVs, the plurality of power supply TSVs connected by the BEOL connections. Further aspects include the BS-RDL PDN being formed of the following: a plurality of parallel alternating power and ground connection lines formed on a backside of the bottom die, the power and ground connection lines being evenly distributed. Additional aspects include the power and ground connection lines are connected to the power supply TSVs. Another aspect includes the power and ground connection lines are formed between UBM pads on the backside of the bottom die.

A further aspect of the present disclosure is a method including: providing a bottom logic die of a 3D IC stack, the bottom logic die having a C4 or CuP pad on a front side of the bottom logic die; providing a top logic die of the 3D IC stack, the top die having a plurality of power/ground micropillars; forming a power delivery unit cell structure between the bottom and top logic dies, the power delivery unit cell having a plurality of power supply TSVs; forming a BS-RDL PDN between the bottom and top logic dies, the BS-RDL PDN including a plurality of the power delivery unit cell structures; and connecting the connection pad electrically to the micropillars through the power supply TSVs and the BS-RDL PDN.

Aspects of the present disclosure include forming the power delivery unit cell structure by: forming a metal cap layer over the connection pad; forming a first metal layer over the metal cap layer; forming a plurality of metal vias between the metal cap layer and the first metal layer, the metal vias evenly distributed on opposite edges of the metal cap layer; forming a second metal layer over the first metal layer; forming the plurality of power supply TSVs in a series with a minimum pitch above a center of the connection pad; forming a first group of intermetal vias between the first metal layer and the second metal layer; forming a second group of intermetal vias between the second metal layer and a top of the power supply TSVs; and forming a plurality of BEOL connections between the power supply TSVs, the BEOL connections connecting the power supply TSVs together. Other aspects include forming the BS-RDL PDN by: forming a plurality of parallel alternating power and ground connection lines in parallel on a backside of the bottom die, the power and ground connection lines being evenly distributed; and connecting the power and ground lines to the power supply TSVs. Further aspects include forming the BS-RDL by: revealing a plurality of TSVs on a backside of the bottom die down to a passivation layer of the bottom die, the plurality of TSVs including the power supply TSVs; forming a seed layer over the passivation layer; forming a first photoresist layer over the seed layer; patterning a RDL opening and a UBM opening through the first photoresist layer down to the seed layer, the RDL opening formed over the power supply TSVs and the UBM opening having a first width; forming a RDL and a UBM capture pad of copper (Cu) on the seed layer through the RDL and UBM openings, respectively; removing the first photoresist layer; forming a second photoresist layer over the RDL and the UBM capture pad; patterning openings in the second photoresist layer over the RDL and the UBM capture pad, the openings having a second width 1 μm to 2 μm less than the first width; forming UBMs of Ni/Au on the RDL and the UBM capture pad through the openings; removing the second photoresist layer; and removing the seed layer on opposite sides of the RDL and the UBM capture pad.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of a single TSV being unable to deliver sufficient current to a top die of a 3D IC stack and uneven current distribution at the top die attendant upon forming a 3D IC logic stack.

Methodology in accordance with embodiments of the present disclosure includes providing a bottom die of a 3D IC stack, the bottom die having a connection pad. A top die of the 3D IC stack with a plurality of power/ground micropillars is provided. A BEOL connection structure with a plurality of power supply TSVs is formed between the bottom and top dies. A BS-RDL PDN including a plurality of the BEOL connection structures is formed between the bottom and top dies and the connection pad is electrically connected to the micropillars through the power supply TSVs and the BS-RDL PDN.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
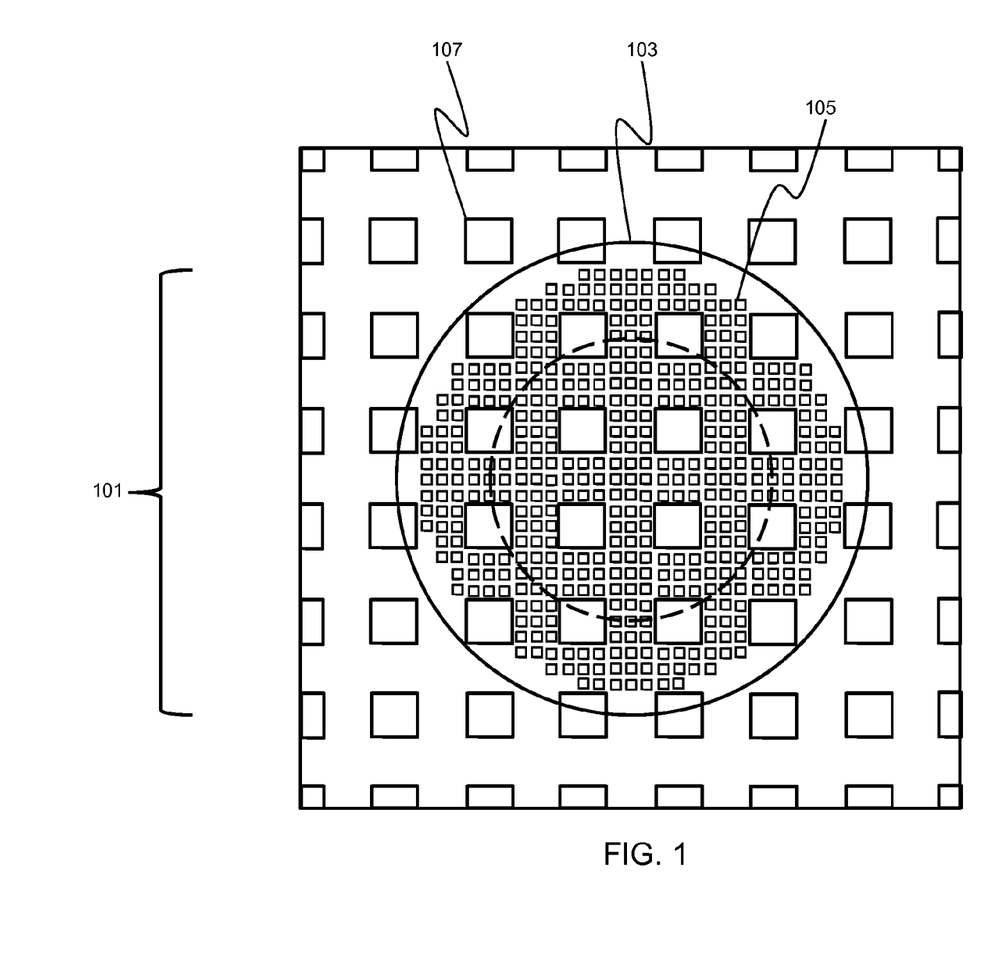
FIG. 1 schematically illustrates a single TSV contact layout, in accordance with an exemplary embodiment.

Adverting to FIG. 1 (FIG. 1 is an overhead view of a single TSV contact layout), the boundaries of a single power supply TSV 101 are indicated by the circle 103. Individual vias 105 are connected to the top of the power supply TSV 101. In this example, there are approximately 429 vias 105, which are each able to conduct 0.164 mA of current from a C4 or CuP connection at 100° C. for a total of 70.356 mA. In an example device where the current requirement is 300 mA to 350 mA per C4 or CuP connection, at least 5 or 6, if not 7 power supply TSVs 101 would be required. The blocks 107 represent an interlayer dielectric (ILD) layer.

Figure 2A:
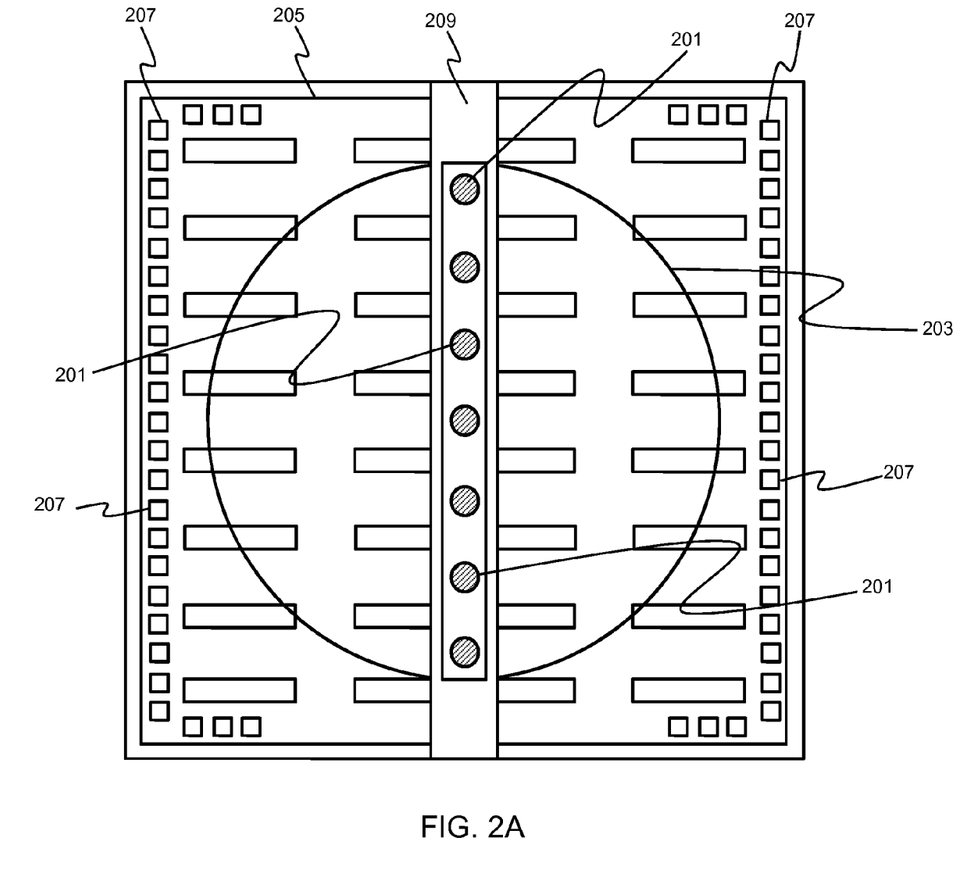
FIGS. 2A and 2B schematically illustrate a BEOL connection structure, in accordance with an exemplary embodiment.
Figure 2B:
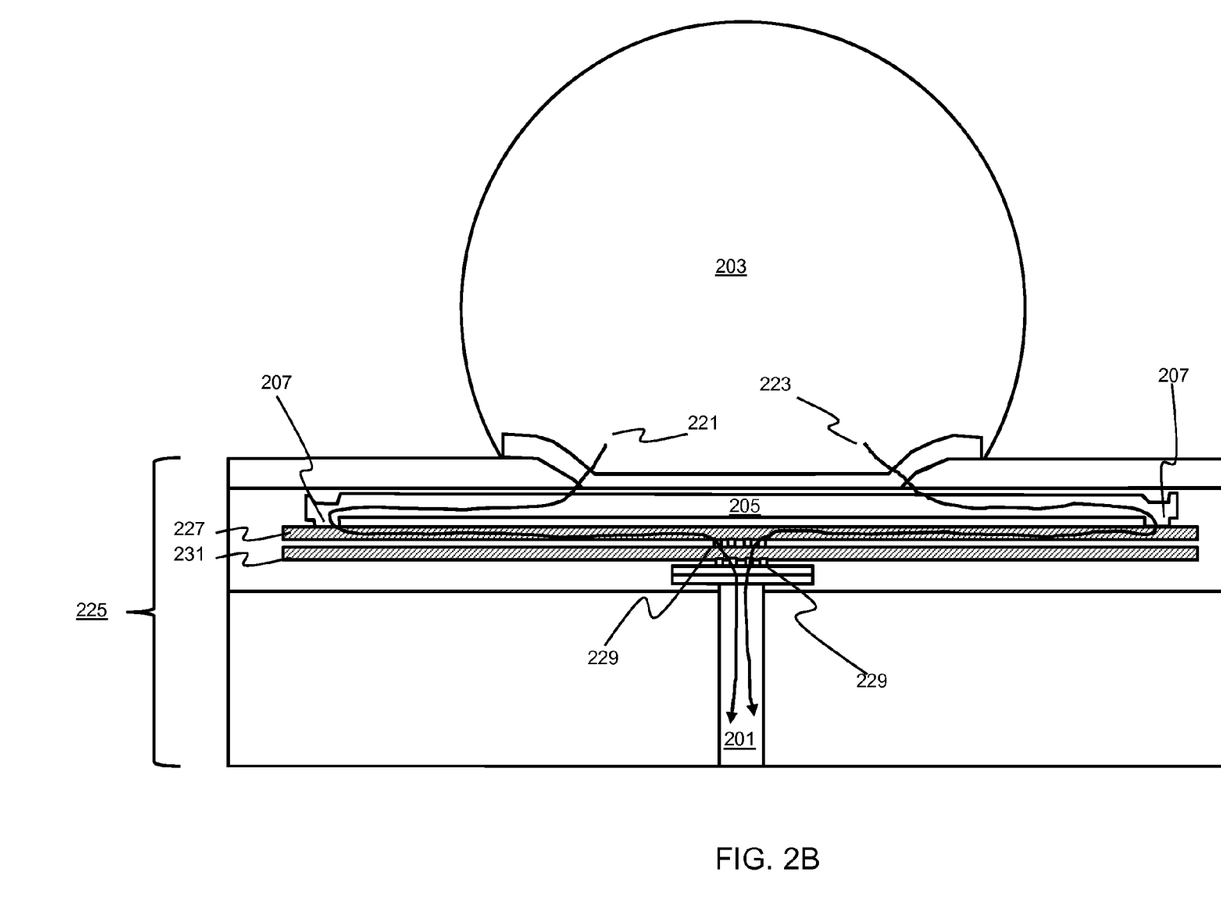

A series of power supply TSVs 201, for example 7, are formed with a minimum pitch above the center of the connection pad 203, e.g., a C4, as depicted in FIG. 2A. (FIG. 2A is an overhead view of the backside of a bottom die and FIG. 2B is a cross section of FIG. 2A). A metal cap layer 205 may be formed, e.g., of aluminum (Al), over the connection pad 203. Metal vias 207 are formed between the metal cap layer 205 and a metal layer (not shown for illustrative convenience). The metal vias 207 are formed only on the left and right sides of the metal cap layer 205 to evenly distribute current to the center row of power supply TSVs 201. The series of power supply TSVs 201 are connected together by a plurality of BEOL connections (not shown for illustrative convenience). In addition, the series of power supply TSVs 201 are connected to a portion of a power/ground line 209.

Adverting to FIG. 2B, current represented by lines 221 and 223 first travels from the contact pad 203, e.g., a C4, of a bottom die 225 to the metal cap layer 205. Next, metal vias 207 (evenly distributed on opposite edges of the metal cap layer 205) transfer the current to a metal layer 227. The metal layer 227 may be formed, for example, of thick Cu. The current then travels from the metal layer 227 through a group of intermetal vias 229 to the metal layer 231 (several thin Cu layers and intermetal via layers representing the full BEOL stack are not shown for illustrative convenience). Thereafter, the current travels through a second group of intermetal vias 229 to a power supply TSV 201.

Figure 3A:
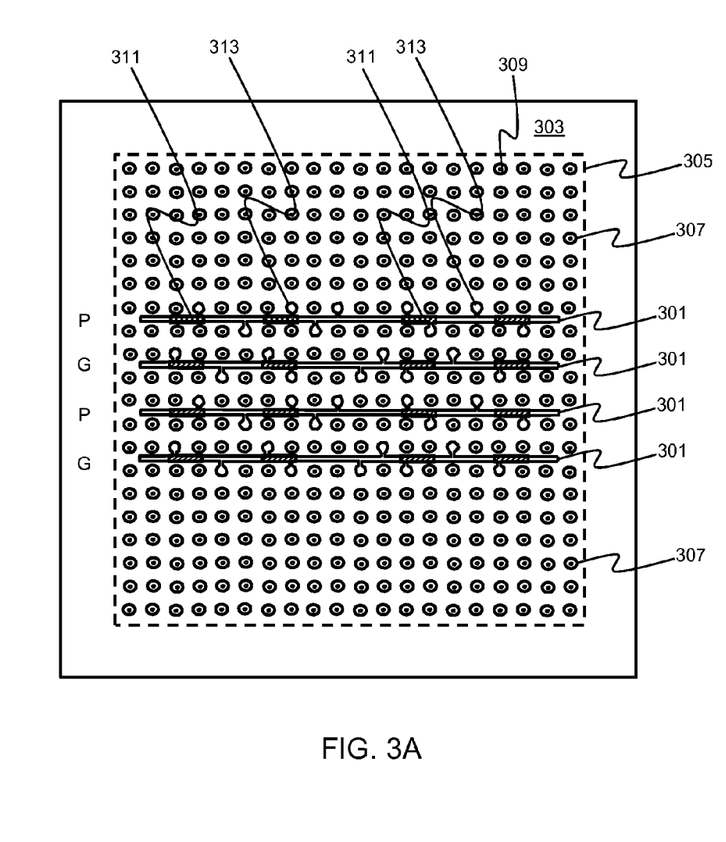
FIGS. 3A through 3F schematically illustrate example BS-RDL PDN configurations, in accordance with exemplary embodiments.
Figure 3B:
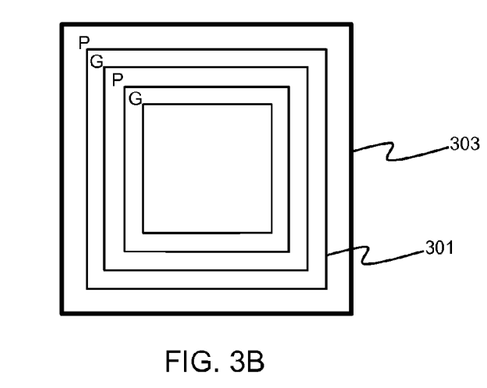
Figure 3C:
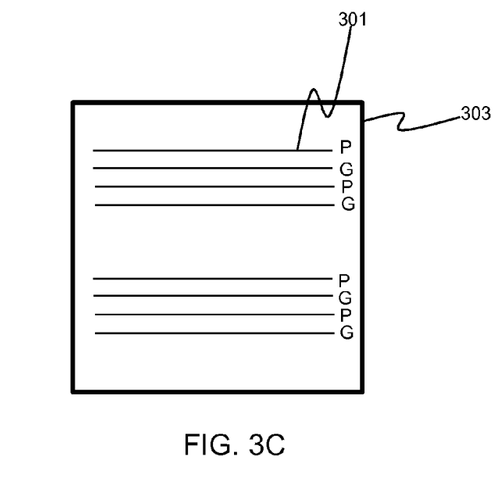
Figure 3D:
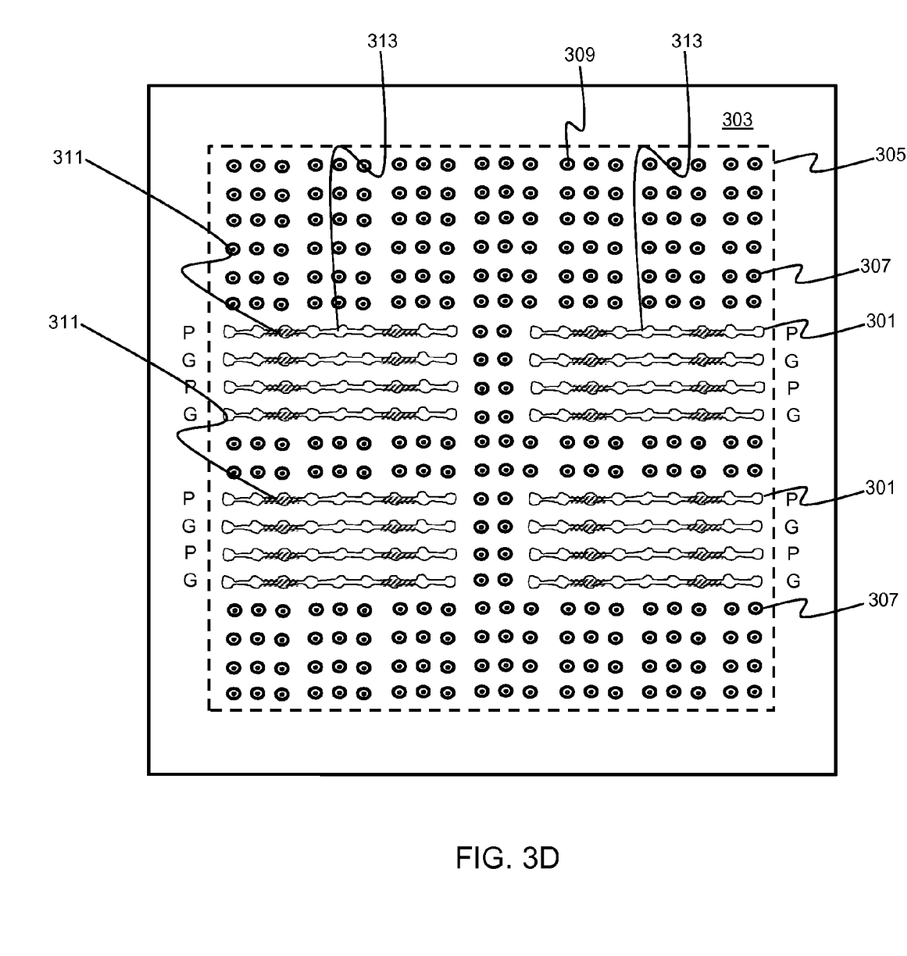
Figure 3E:
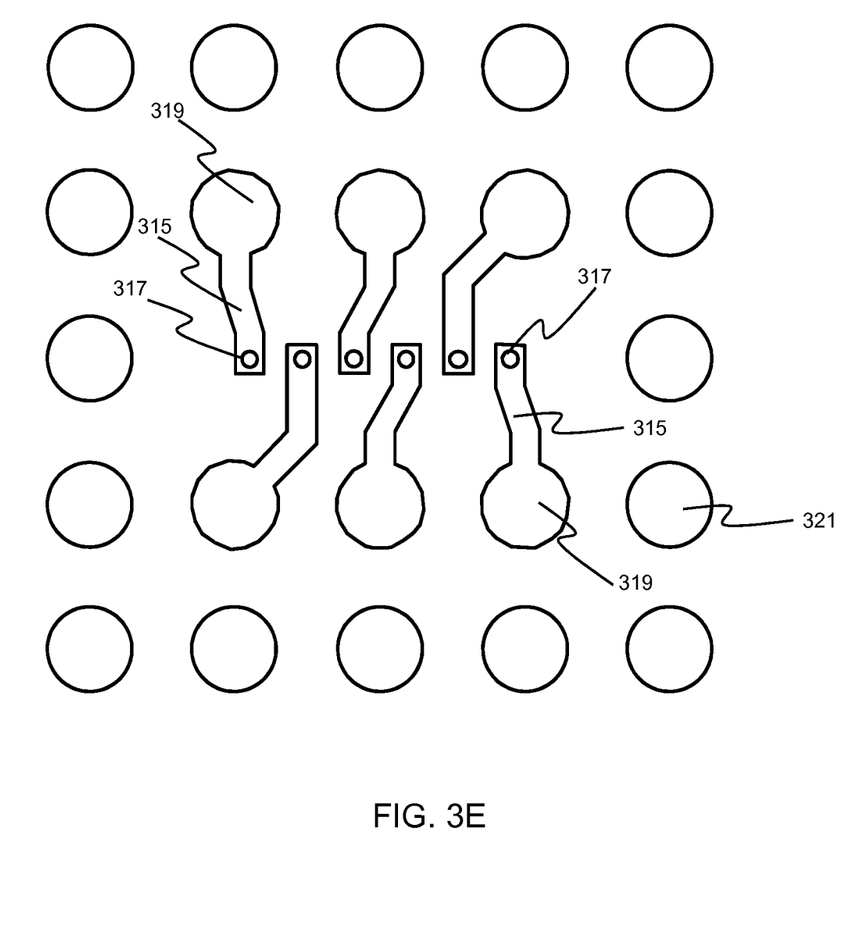
Figure 3F:
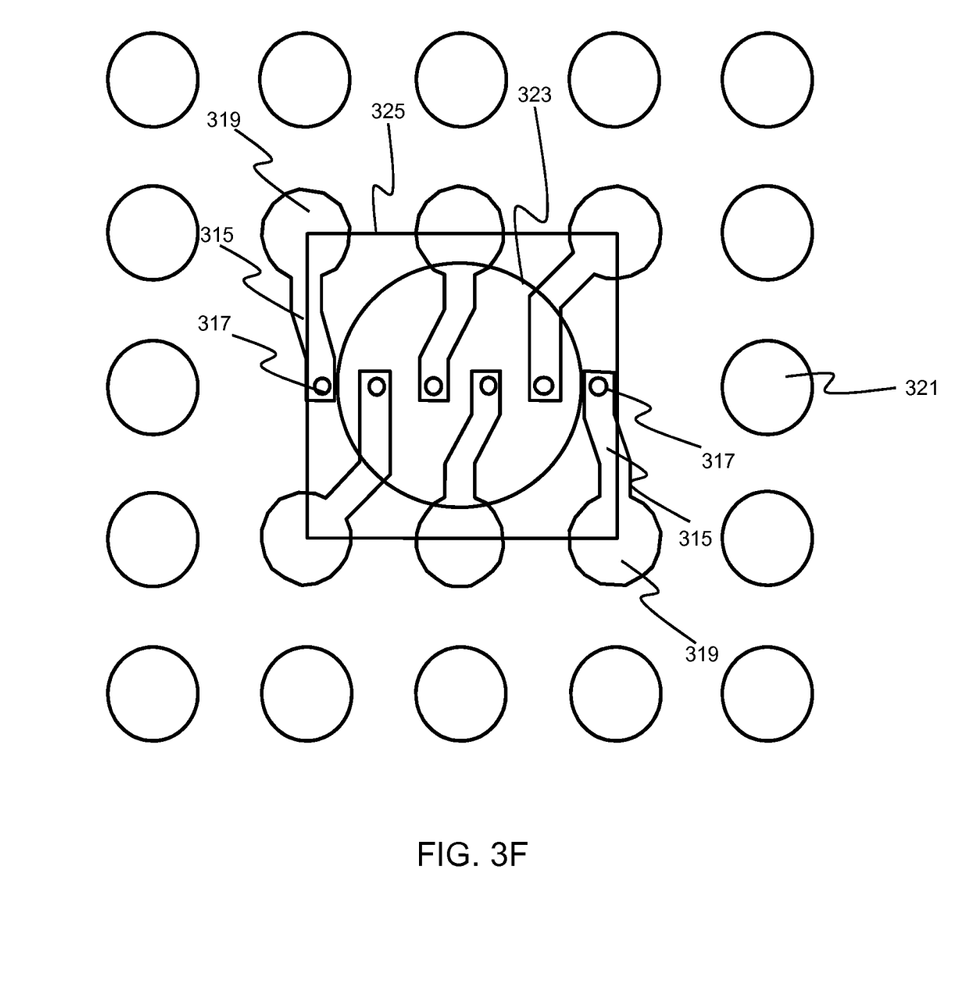

The BS-RDL PDN is formed with a number of parallel alternating power and ground connection lines 301, as depicted in FIG. 3A. (FIG. 3A is an overhead view of the backside of the bottom die 303). The dashed line 305 represents an approximate location of where the top die of the 3D IC stack may be located. In this example, the power and ground connection lines 301 are evenly distributed between the UBM pads 307. Utilizing an even distribution of lines or rings on the backside can help to control overall chip warpage. The UBM pads 307 represent locations where micropillars of the top die may connect. The dot 309 inside of the UBM pads 303 represents a TSV. The patterned rectangle 311 represents a group of the power supply TSVs similar to the series of the power supply TSVs 201 of FIG. 2A. Power/Ground pins 313 are also connected to the corresponding power/ground connection lines 301 and may be connected to the top die wherever needed. Alternatively, the power and ground connection lines 301 may be formed in alternating concentric rings between the UBM pads (not shown for illustrative convenience) as depicted in FIG. 3B; in groups of parallel alternating power and ground connection lines 301 as depicted in FIG. 3C; or the power and ground connection lines 301 may connect to multiple power/ground micropillars of the top die (not shown for illustrative convenience) rather than between rows of UBM pads 301, as depicted in FIG. 3D. A further BS-RDL routing scheme is depicted in FIG. 3E. A BS-RDL 315 is connected to both a power/ground TSV 317 and a power/ground UBM 319 and the group of BS-RDLs 315 are formed within a field of standard UBMs 321. Adverting to FIG. 3F, similar to FIG. 2A, the group of BS-RDLs 315 are formed over a contact pad 323 and are connected to a metal cap layer 325. Again, the group of BS-RDLs 315 is formed within a field of standard UBMs 321. Other configurations of the power/ground connection lines 301 could also be conceived, which are not shown, and would be obvious to those skilled in the art.

Figure 4:
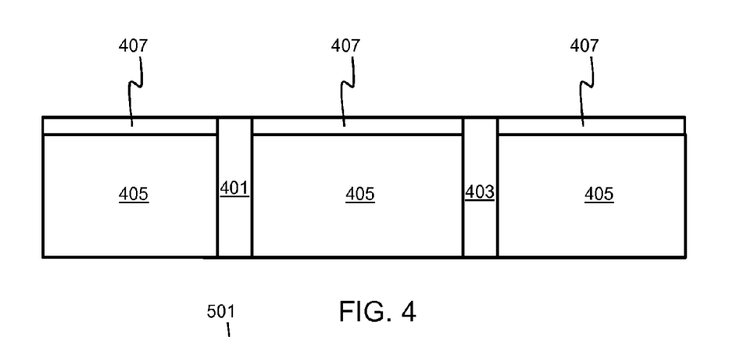
FIGS. 4 through 12 schematically illustrate a process flow for forming a BS-RDL, in accordance with an exemplary embodiment.
Figure 5:
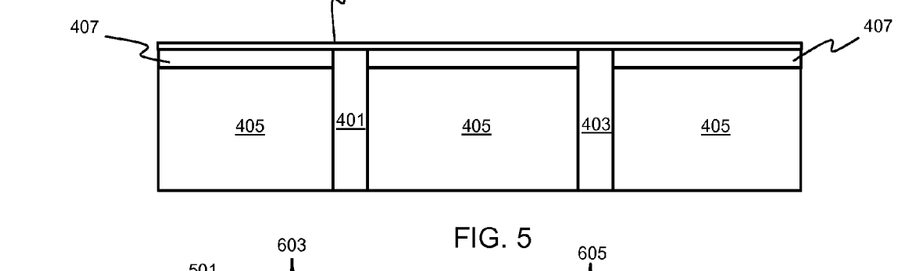
Figure 6:
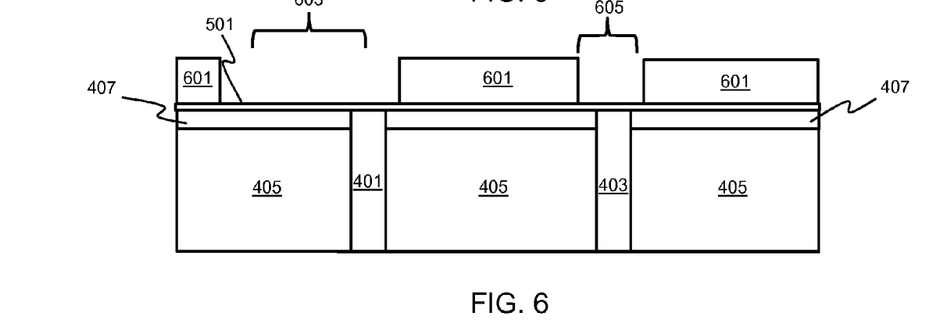

Adverting to FIG. 4, a BS-RDL may be formed by first revealing TSVs 401 and 403 on a backside of a bottom die 405. TSV 401 is a power supply TSV that will eventually be connected with a series of other power supply TSVs (not shown for illustrative convenience). An inorganic passivation layer 407, e.g., formed of oxide/nitride, remains on the backside of the bottom die 405 after the backside TSV reveal process. Next, a seed layer 501 is formed over the passivation layer 407, as depicted in FIG. 5. The seed layer 501 may be formed, for example, of titanium/copper (Ti/Cu). Adverting to FIG. 6, a photoresist layer 601 is formed over the seed layer 501, and then a RDL opening 603 and a UBM opening 605 are photolithographically patterned for subsequent Cu plating. The RDL opening 603 is formed over the power supply TSV 401. The width of the RDL opening 603 corresponds to the width of the series of power supply TSVs and the RDL width must provide a large enough surface to account for alignment registration errors. The width of the UBM opening 605 corresponds to the width of a UBM capture pad, e.g., 30 μm.

Figure 7:
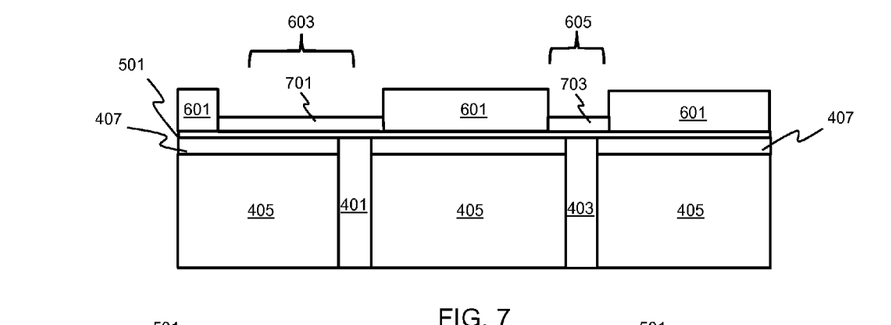
Figure 8:
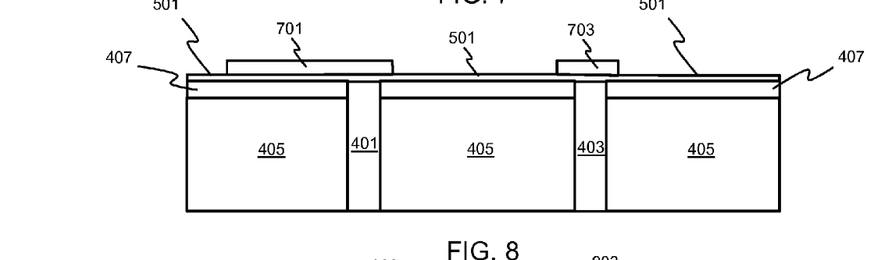
Figure 9:
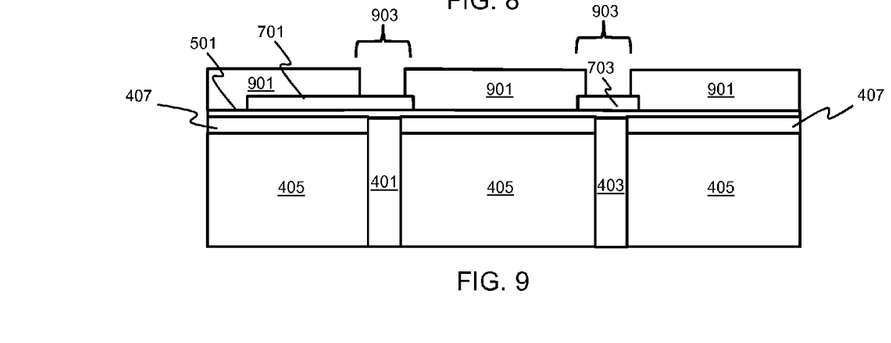

The RDL 701 and the UBM capture pad 703 are formed on the seed layer 501 through the RDL opening 603 and the UBM opening 605, respectively, as depicted in FIG. 7. The RDL 701 and the UBM capture pad 703 may be formed, e.g., by Cu electroplating. Adverting to FIG. 8, the photoresist layer 601 is stripped; however, the seed layer 501 remains. Next, a photoresist layer 901 is formed over the RDL 701, the UBM capture pad 703, and the seed layer 501, as depicted in FIG. 9. The photoresist layer 901 is then patterned for a UBM solderable area. In particular, the size of each opening 903 is 1 μm to 2 μm smaller than the UBM opening 605 to allow for alignment registration errors.

Figure 10:
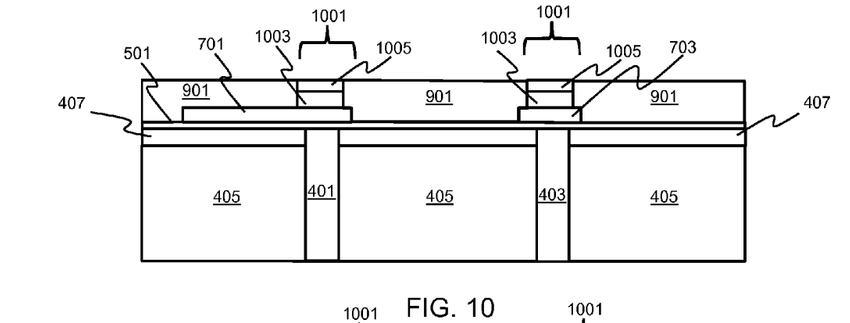
Figure 11:
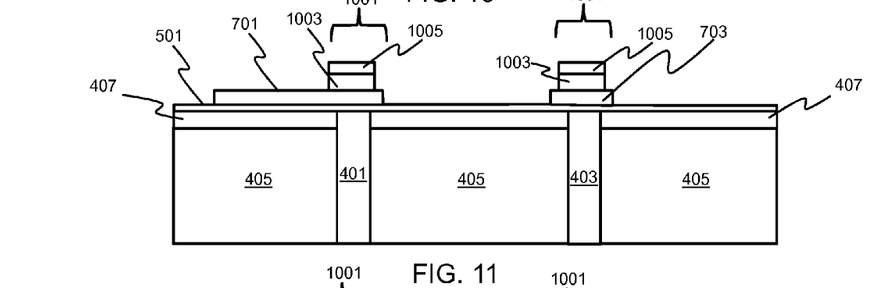
Figure 12:
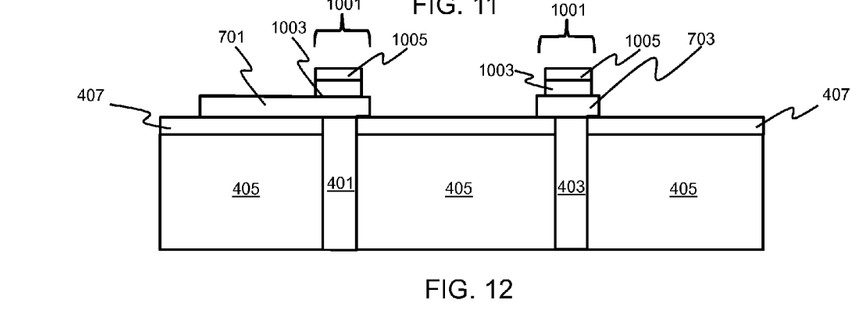

Adverting to FIG. 10, UBMs 1001 are formed in the UBM openings 903. The UBMs 1001 may be formed, for example, of one or more solderable layers, e.g., a nickel layer 1003 and a gold layer 1005. Next, the photoresist layer 901 is stripped, as depicted in FIG. 11. Thereafter, the seed layer 501 is stripped, as depicted in FIG. 12. In the resulting device, the RDL 701 is connected to a series of power supply TSVs 401 (not shown for illustrative convenience).

Figure 13:
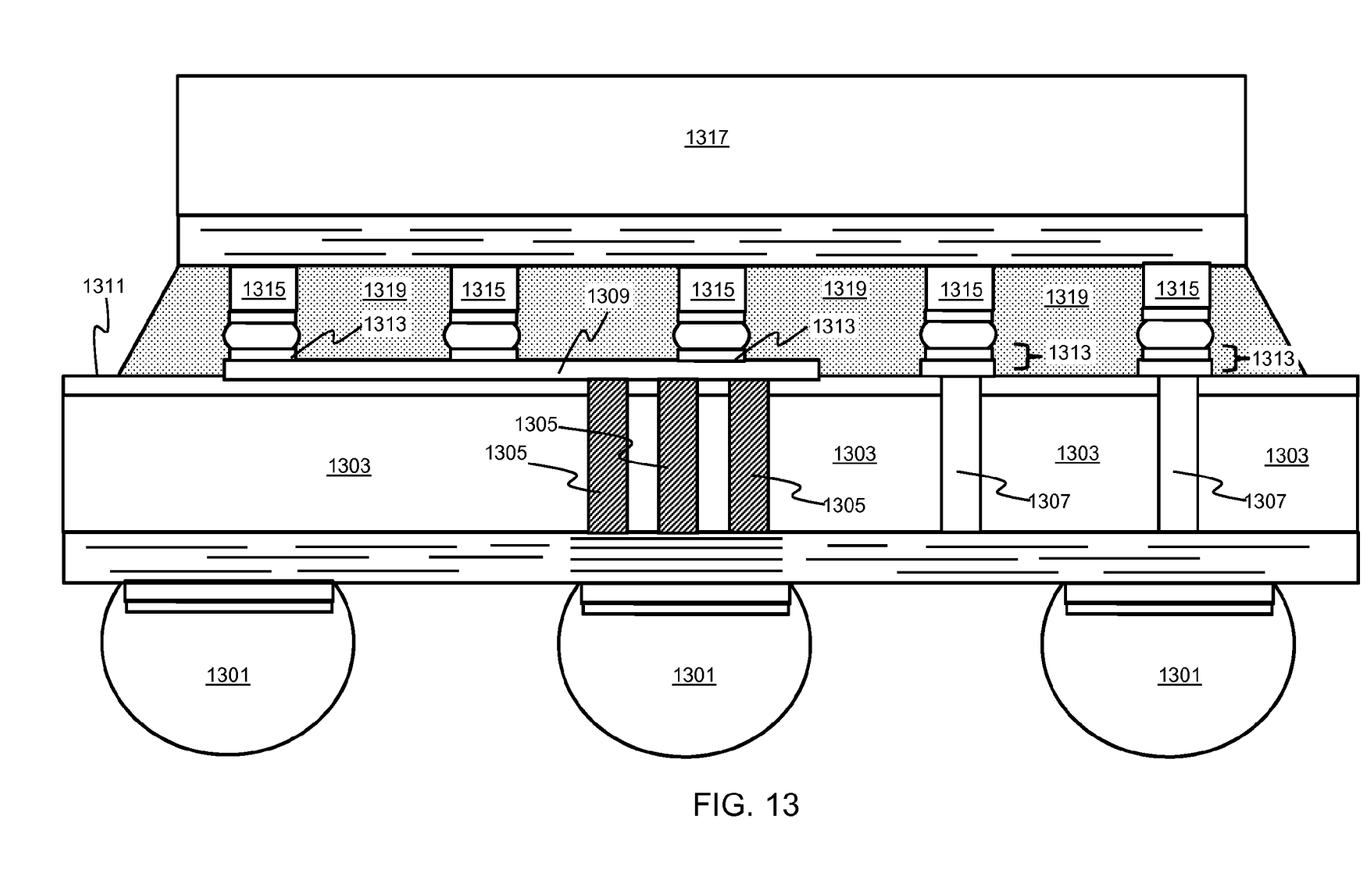
FIG. 13 schematically illustrates a fully formed BS-RDL PDN 3D IC stack, in accordance with an exemplary embodiment.

Adverting to FIG. 13, a connection pad 1301 of a bottom die 1303, e.g., a C4 or CuP, is connected to a group of power supply TSVs 1305. The power supply TSVs 1305, unlike the TSVs 1307, are also connected to the RDL 1309, which is formed on the passivation layer 1311 of the bottom die 1303. The RDL 1309 is also connected to the UBMs 1313, which are connected to the micropillars 1315 of the top die 1317. During the formation of the RDL 1309, as described above, the RDL 1309 does not need to be covered and, therefore, additional process steps are avoided because the RDL 1309 gets embedded in the underfill layer 1319 when the bottom die 1303 and the top die 1317 are stacked into a 3D IC stack.

The embodiments of the present disclosure can achieve several technical effects including enabling full current from a substrate C4/CuP connection to a top die with minimized risk for electromigration failures; BS-RDL usage allows for uniform distribution of power/ground to required locations for a top die; and the BEOL connection structure fits within a single C4/CuP pad for simple unit cell layout. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various highly integrated semiconductor devices including 3D IC logic stacks.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a bottom die of a three-dimensional (3D) integrated circuit (IC) stack, the bottom die having a connection pad;
   providing a top die of the 3D IC stack, the top die having a plurality of power/ground micropillars;
   forming a back end of line (BEOL) connection structure between the bottom and top dies, the BEOL connection structure formed by:
      forming a metal cap layer over the connection pad;
      forming a first metal layer over the metal cap layer;
      forming a plurality of metal vias between the metal cap layer and the first metal layer, the metal vias evenly distributed on opposite edges of the metal cap layer;
      forming a second metal layer over the first metal layer;
      forming the plurality of power supply TSVs in series with a minimum pitch above a center of the connection pad;
      forming a first group of intermetal vias between the first metal layer and the second metal layer;
      forming a second group of intermetal vias between the second metal layer and a top of the power supply TSVs; and
      forming a plurality of BEOL connections between the power supply TSVs, the BEOL connections connecting the power supply TSVs together;
   forming a backside redistribution layer (BS-RDL) power delivery network (PDN) between the bottom and top dies, the BS-RDL PDN including a plurality of the BEOL connection structures; and
   connecting the connection pad electrically to the micropillars through the power supply TSVs and the BS-RDL PDN.

2. The method according to claim 1, comprising forming the BS-RDL PDN by:
   forming a plurality of parallel alternating power and ground connection lines on a backside of the bottom die, the power and ground connection lines being evenly distributed; and
   connecting the power and ground lines to the power supply TSVs.

3. The method according to claim 2, comprising forming the power and ground lines between under-bump metallurgy (UBM) pads on a backside of the bottom die.

4. The method according to claim 1, comprising forming the BS-RDL by:
   revealing a plurality of TSVs on a backside of the bottom die down to a passivation layer of the bottom die, the plurality of TSVs including the power supply TSVs;
   forming a seed layer over the passivation layer;
   forming a first photoresist layer over the seed layer;
   patterning a RDL opening and a UBM opening through the first photoresist layer down to the seed layer, the RDL opening formed over the power supply TSVs and the UBM opening having a first width;
   forming a RDL and a UBM capture pad on the seed layer through the RDL and UBM openings, respectively;
   removing the first photoresist layer;
   forming a second photoresist layer over the RDL and the UBM capture pad;
   patterning openings in the second photoresist layer over the RDL and the UBM capture pad, the openings having a second width less than the first width;
   forming UBMs on the RDL and the UBM capture pad through the openings;
   removing the second photoresist layer; and
   removing the seed layer on opposite sides of the RDL and the UBM capture pad.

5. The method according to claim 4, comprising patterning the openings based on a location of the micropillars.

6. The method according to claim 4, comprising patterning the openings 1 micron (μm) to 2 μm less than the UBM opening.

7. The method according to claim 4, comprising forming the UBMs by:
   forming one or more solderable layers on the RDL and the UBM capture pad.

8. The method according to claim 1, wherein the connection pad is formed of a controlled-collapse chip connection (C4) or copper pillar (CuP).

9. The method according to claim 1, wherein the bottom and top dies are logic dies.

10. A method comprising:
    providing a bottom logic die of a three-dimensional (3D) integrated circuit (IC) stack, the bottom logic die having a controlled-collapse chip connection (C4) or copper pillar (CuP) pad on a front side of the bottom logic die;
    providing a top logic die of the 3D IC stack, the top die having a plurality of power/ground micropillars;
    forming a power delivery unit cell structure between the bottom and top logic dies, the power delivery unit cell formed by:
       forming a metal cap layer over the connection pad;
       forming a first metal layer over the metal cap layer;
       forming a plurality of metal vias between the metal cap layer and the first metal layer, the metal vias evenly distributed on opposite edges of the metal cap layer;
       forming a second metal layer over the first metal layer;
       forming the plurality of power supply TSVs in a series with a minimum pitch above a center of the connection pad;
       forming a first group of intermetal vias between the first metal layer and the second metal layer;
       forming a second group of intermetal vias between the second metal layer and a top of the power supply TSVs; and
       forming a plurality of BEOL connections between the power supply TSVs, the BEOL connections connecting the power supply TSVs together;
    forming a backside redistribution layer (BS-RDL) power delivery network (PDN) between the bottom and top logic dies, the BS-RDL PDN including a plurality of the power delivery unit cell structures; and
    connecting the connection pad electrically to the micropillars through the power supply TSVs and the BS-RDL PDN.

11. The method according to claim 10, comprising forming the BS-RDL PDN by:
- forming a plurality of parallel alternating power and ground connection lines in parallel on a backside of the bottom die, the power and ground connection lines being evenly distributed; and
- connecting the power and ground lines to the power supply TSVs.

12. The method according to claim 10, comprising forming the BS-RDL by:
- revealing a plurality of TSVs on a backside of the bottom die down to a passivation layer of the bottom die, the plurality of TSVs including the power supply TSVs;
- forming a seed layer over the passivation layer;
- forming a first photoresist layer over the seed layer;
- patterning a RDL opening and a UBM opening through the first photoresist layer down to the seed layer, the RDL opening formed over the power supply TSVs and the UBM opening having a first width;
- forming a RDL and a UBM capture pad of copper (Cu) on the seed layer through the RDL and UBM openings, respectively;
- removing the first photoresist layer;
- forming a second photoresist layer over the RDL and the UBM capture pad;
- patterning openings in the second photoresist layer over the RDL and the UBM capture pad, the openings having a second width 1 micron (μm) to 2 μm less than the first width;
- forming UBMs of nickel/gold (Ni/Au) on the RDL and the UBM capture pad through the openings;
- removing the second photoresist layer; and
- removing the seed layer on opposite sides of the RDL and the UBM capture pad.

\* \* \* \* \*